US012803538B2

(12) United States Patent
Sun et al.

(10) Patent No.: US 12,803,538 B2
(45) Date of Patent: Nov. 17, 2026

(54) MEMORY SYSTEM AND SIGNAL MONITORING DEVICE THEREOF

(71) Applicant: Montage Technology (Kunshan) Co., Ltd., Suzhou (CN)

(72) Inventors: Chunlai Sun, Shanghai (CN); Gang Yan, Shanghai (CN)

(73) Assignee: Montage Technology (Kunshan) Co., Ltd., Suzhou (CN)

( * ) Notice: Subject to any disclaimer, the term of this patent is extended or adjusted under 35 U.S.C. 154(b) by 1 day.

(21) Appl. No.: 19/264,779

(22) Filed: Jul. 9, 2025

(65) Prior Publication Data

US 2026/0058641 A1 Feb. 26, 2026

(30) Foreign Application Priority Data

Aug. 23, 2024 (CN) ........................ 202411166031.4

(51) Int. Cl.

| | |
|---|---|
| ***H03K 3/021*** | (2006.01) |
| ***G11C 11/4076*** | (2006.01) |
| ***G11C 11/408*** | (2006.01) |
| ***G11C 11/4093*** | (2006.01) |
| ***H03K 3/011*** | (2006.01) |
| ***H03K 3/0231*** | (2006.01) |

(52) U.S. Cl.

CPC ........ *H03K 3/0231* (2013.01); *G11C 11/4076* (2013.01); *G11C 11/4082* (2013.01); *G11C 11/4093* (2013.01); *H03K 3/011* (2013.01)

(58) Field of Classification Search

CPC .. H03K 3/0231; H03K 3/011; G11C 11/4076; G11C 11/4082; G11C 11/4093; G11C 11/4074; G06F 13/1673; G06F 13/1689

See application file for complete search history.

(56) References Cited

U.S. PATENT DOCUMENTS

| | | | | |
|---|---|---|---|---|
| 12,100,474 | B2 * | 9/2024 | Xu | G06F 13/1689 |
| 12,724,047 | B2 * | 9/2026 | Chen | G01R 25/005 |
| 12,726,189 | B2 * | 9/2026 | Kim | H03K 5/22 |
| 2009/0256629 | A1 * | 10/2009 | Tseng | H03L 7/091<br>329/304 |

(Continued)

FOREIGN PATENT DOCUMENTS

KR 101794712 B1 * 11/2017 .......... H04L 25/061

*Primary Examiner* — Adam D Houston

(74) *Attorney, Agent, or Firm* — JCIPRNET

(57) ABSTRACT

A signal monitoring device includes a signal receiver, a first sampler, a second sampler, a third sampler, and a fourth sampler. The signal receiver receives an input signal and a reference voltage, and generates a first receiving signal and a second receiving signal. The first sampler and the second sampler sample the first receiving signal and the second receiving signal according to a first clock signal and a second clock signal, and generate a first sampling signal and a second sampling signal. The third sampler samples the first receiving signal and the second receiving signal according to one of multiple third clock signals and a first sampling reference voltage, to generate a third sampling signal. The fourth sampler samples the first sampling signal and the second receiving signal according to one of multiple fourth clock signals and a second sampling reference voltage, to generate a fourth sampling signal.

20 Claims, 4 Drawing Sheets

(56) References Cited

U.S. PATENT DOCUMENTS

| | | | | |
|---|---|---|---|---|
| 2023/0208696 | A1* | 6/2023 | Lee | H04B 1/16 375/262 |
| 2024/0356573 | A1* | 10/2024 | Ransijn | H03M 1/1245 |
| 2026/0058641 | A1* | 2/2026 | Sun | G11C 11/4093 |

* cited by examiner

MEMORY SYSTEM AND SIGNAL MONITORING DEVICE THEREOF

CROSS-REFERENCE TO RELATED APPLICATION

This application claims the priority benefit of China application serial no. 202411166031.4, filed on Aug. 23, 2024. The entirety of the above-mentioned patent application is hereby incorporated by reference herein and made a part of this specification.

BACKGROUND

Technical Field

The disclosure relates to a memory system and a signal monitoring device thereof, and in particular to a memory system and a signal monitoring device thereof which may monitor signal eye diagrams in real time.

Description of Related Art

With the increase in data transmission rate in a double data rate synchronous dynamic random access (DDR) memory system, signal transmission of a memory interface (especially a high-speed memory interface) faces increasingly greater challenges. The reason is that the increase in data transmission rate may cause more severe problems such as inter-symbol interference (ISI), signal reflection, and crosstalk, all of which may damage signal integrity. In existing technology, to improve signal integrity, designers may conduct equalization training on the memory interface to mitigate signal issues such as ISI. For example, the optimal sampling phase of the initialization signal and ISI equalization coefficient is obtained through initialization equalization training. However, during the normal operation of the memory system, changes in environmental temperature, humidity, and operating voltage may alter the characteristics of the transmission link, while the sampling phase and ISI equalization coefficient originally obtained through training may not follow real-time environmental changes, which may cause deterioration of an eye diagram of an input signal of the memory interface. In existing technology, periodic training is required during the normal operation of the DDR memory system to continuously adjust the optimal sampling phase and ISI equalization coefficient, thereby adapting to environmental changes. However, the time cost and bandwidth reduction problems caused by periodic training are intolerable.

SUMMARY

The disclosure provides a memory system and a signal monitoring device thereof which may monitor the eye diagram quality of input signals in real time, thereby enabling timely and targeted retraining of relevant interfaces when deterioration of the eye diagram is detected.

According to an embodiment of the disclosure, a signal monitoring device includes a signal receiver, a first sampler, a second sampler, a third sampler, and a fourth sampler. The signal receiver receives an input signal and a reference voltage, and generates a first receiving signal and a second receiving signal, where the first receiving signal and the second receiving signal are differential signals. The first sampler samples the first receiving signal and the second receiving signal to generate a first sampling signal according to a first clock signal. The second sampler samples the first receiving signal and the second receiving signal to generate a second sampling signal according to a second clock signal. The third sampler, based on a first sampling reference voltage, samples the first receiving signal and the second receiving signal to generate a third sampling signal according to one of multiple third clock signals. The fourth sampler, based on a second sampling reference voltage, samples the first receiving signal and the second receiving signal to generate a fourth sampling signal according to one of multiple fourth clock signals. The third clock signals differ in sequence by a first time delay in timing, the fourth clock signals differ in sequence by a second time delay in timing, and the first clock signal and the second clock signal complement each other in phase.

According to an embodiment of the disclosure, a memory system includes a memory controller and a central buffer. The central buffer is coupled to the memory controller, and includes the signal monitoring device as described above.

The memory system further includes multiple data buffers. The data buffers are coupled between the central buffer and the memory controller. Each of the data buffers includes the signal monitoring device as described above.

DESCRIPTION OF THE EMBODIMENTS

The following specific examples illustrate the implementation manners of the disclosure. Those skilled in the art may easily understand other advantages and effects of the disclosure from the content disclosed in this specification. The disclosure may also be implemented or applied through other specific embodiments, and various details in this specification may also be modified or changed based on different perspectives and applications, without departing from the spirit of the disclosure. It should be noted that, in the absence of conflict, the features in the following embodiments and embodiments may be combined with each other.

It needs to be explained that the illustrations provided in the following embodiments only illustrate the basic concept of the disclosure in a schematic manner. Therefore, the illustrations only show components related to the disclosure rather than being drawn according to the actual number, shape, and size of components during implementation. In actual implementation, the form, quantity, and proportion of each component may be arbitrarily changed, and the layout pattern of the components may also be more complex.

Figure 1:
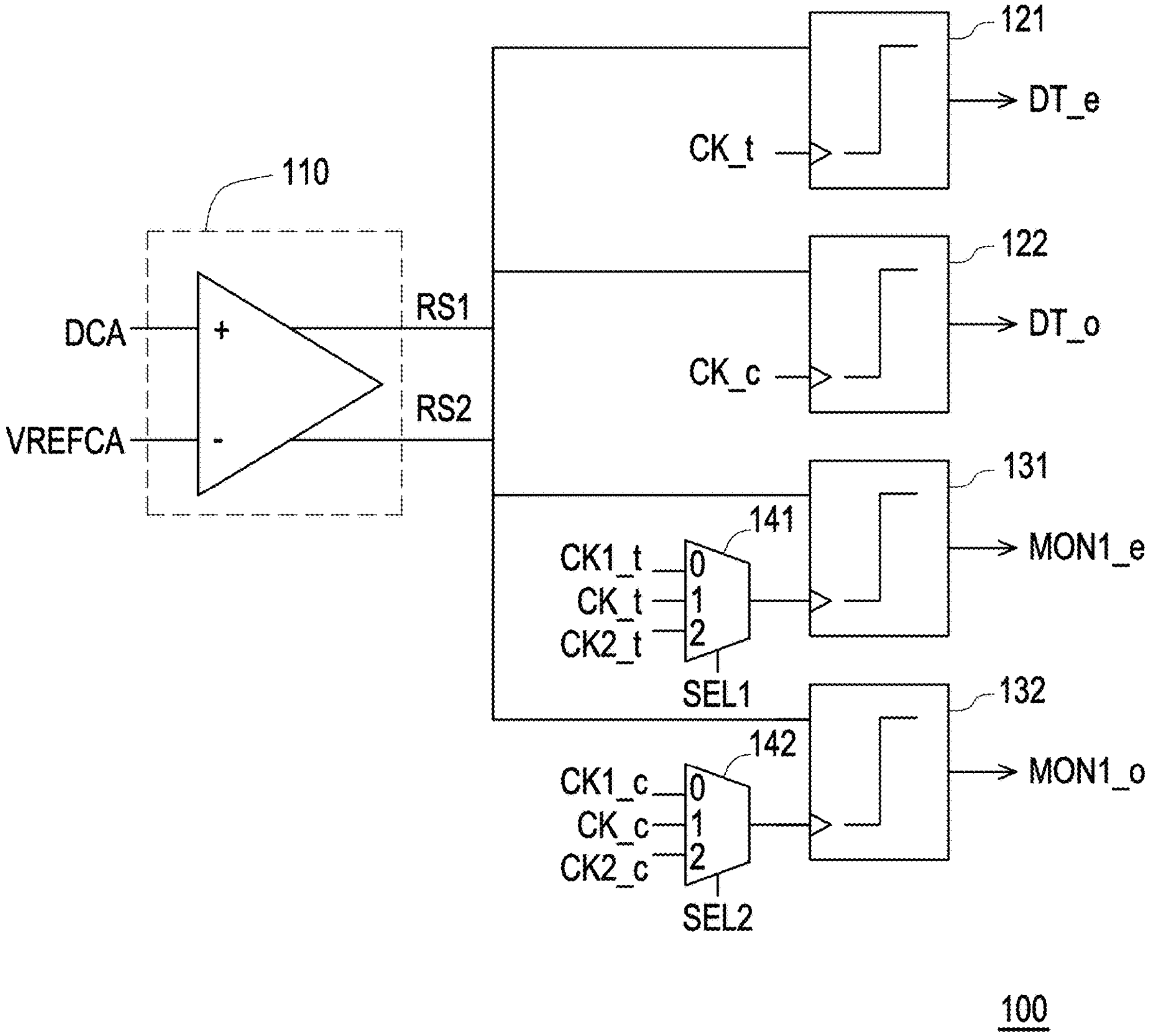
FIG. 1 shows a schematic diagram of a signal monitoring device according to an embodiment of the disclosure.

Referring to FIG. 1, FIG. 1 shows a schematic diagram of a signal monitoring device according to an embodiment of the disclosure. A signal monitoring device 100 includes a signal receiver 110 and samplers 121, 122, 131, and 132. The signal receiver 110 is configured to receive an input signal and a reference voltage, and generate a first receiving signal and a second receiving signal according to the input signal and the reference voltage. The input signal may be a command/address signal DCA or a data signal DQ. FIG. 1 only illustrates an example using the command/address signal DCA, but those skilled in the art may understand that the signal monitoring device of the disclosure may also be applied to other signals of the memory system or interface signals of other systems/devices, which is not limited by the disclosure. In the following description, monitoring the command/address signal DCA is used as an example.

In some embodiments, the signal receiver 110 may be a differential amplifier. A positive input terminal of the differential amplifier may be configured to receive the command/address signal DCA, and a negative input terminal of the differential amplifier may be configured to receive a reference voltage VREFCA. The differential amplifier may generate a first receiving signal RS1 and a second receiving signal RS2 according to the reference voltage VREFCA and the command/address signal DCA. The command/address signal DCA may be an alternating current signal. The reference voltage VREFCA may be between a minimum voltage and a maximum voltage of the command/address signal DCA. In some embodiments, the reference voltage VREFCA may be set according to a median value of the minimum voltage and the maximum voltage of the command/address signal DCA, to maximize the upper and lower voltage margins sampled by a first sampler and a second sampler.

The signal receiver 110 may generate the first receiving signal RS1 and the second receiving signal RS2 by conducting a differential operation on the command/address signal DCA and the reference voltage VREFCA. The first receiving signal RS1 and the second receiving signal RS2 are a pair of differential signals.

The samplers 121 and 122 are configured to receive the first receiving signal RS1 and the second receiving signal RS2. The samplers 121 and 122 further respectively receive clock signals CK_t and CK_c, and respectively sample the first receiving signal RS1 and the second receiving signal RS2 to generate a first sampling signal DT_e and a second sampling signal DT_o respectively according to the clock signals CK_t and CK_c. In this embodiment, the clock signals CK_t and CK_c may complement each other in phase (with a phase difference of 180 degrees). The first sampling signal DT_e and the second sampling signal DT_o may be respectively represented by the following mathematical expressions:

when at the rising edge of the clock signal CK_t, DT_e=sign (RS1−RS2); and when at the rising edge of the clock signal CK_c, DT_o=sign (RS1−RS2);

where sign( ) is an operation function for determining a sign of a real number.

In addition, the samplers 131 and 132 are also configured to receive the first receiving signal RS1 and the second receiving signal RS2. The sampler 131 may sample the first receiving signal RS1 and the second receiving signal RS2 to generate a third sampling signal MON1_*e* according to one of multiple clock signals CK1_*t*, CK_t, and CK2_*t*, and based on a first sampling reference voltage VSref1 (not shown in the figure). When at the rising edge of the clock signal CK1_*t*, CK_t, or CK2_*t*, the third sampling signal MON1_*e* may be expressed as MON1_*e*=sign (RS1−RS2−VSref1).

The sampler 132 may sample the first receiving signal RS1 and the second receiving signal RS2 to generate a fourth sampling signal MON1_*o* according to one of the multiple clock signals CK1_*c*, CK_c, and CK2_*c*, and based on a second sampling reference voltage VSref2 (not shown in the figure). When at the rising edge of the clock signal CK1_*c*, CK_c, or CK2_*c*, the fourth sampling signal MON1_*o* may be expressed as MON1_*o*=sign (RS1−RS2−VSref2).

In this embodiment, the clock signals CK1_*t*, CK_t, and CK2_*t* differ in sequence by a first time delay in timing, which means that there is a first time delay between the clock signal CK1_*t* and the clock signal CK_t, and the same first time delay exists between the clock signal CK_t and the clock signal CK2_*t*. Similarly, the clock signals CK1_*c*, CK_c, and CK2_*c* differ in sequence by a second time delay in timing, which means that there is a second time delay between the clock signal CK1_*c* and the clock signal CK_c, and the same second time delay exists between the clock signal CK_c and the clock signal CK2_*c*. In this embodiment, the first time delay may be the same as the second time delay. In other embodiments of the disclosure, the first time delay may be different from the second time delay. In terms of phase relationship, a phase of the clock signal CK1_*t* may lead a phase of the clock signal CK_t, and a phase of the clock signal CK_t may lead a phase of the clock signal CK2_*t*. Likewise, a phase of the clock signal CK1_*c* may lead a phase of the clock signal CK_c, and the phase of the clock signal CK_c may lead a phase of the clock signal CK2_*c*.

The signal monitoring device 100 further includes selectors 141 and 142. The selectors 141 and 142 may be multiplexers (MUX). The selector 141 may select one signal at a time from the clock signals CK1_*t*, CK_t, and CK2_*t* according to the selecting signal SEL1 and transmit the signal to the sampler 131. The selector 142 may select one signal at a time from the clock signals CK1_*c*, CK_c, and CK2_*c* according to the selecting signal SEL2 and transmit the signal to the sampler 132.

Figure 2:
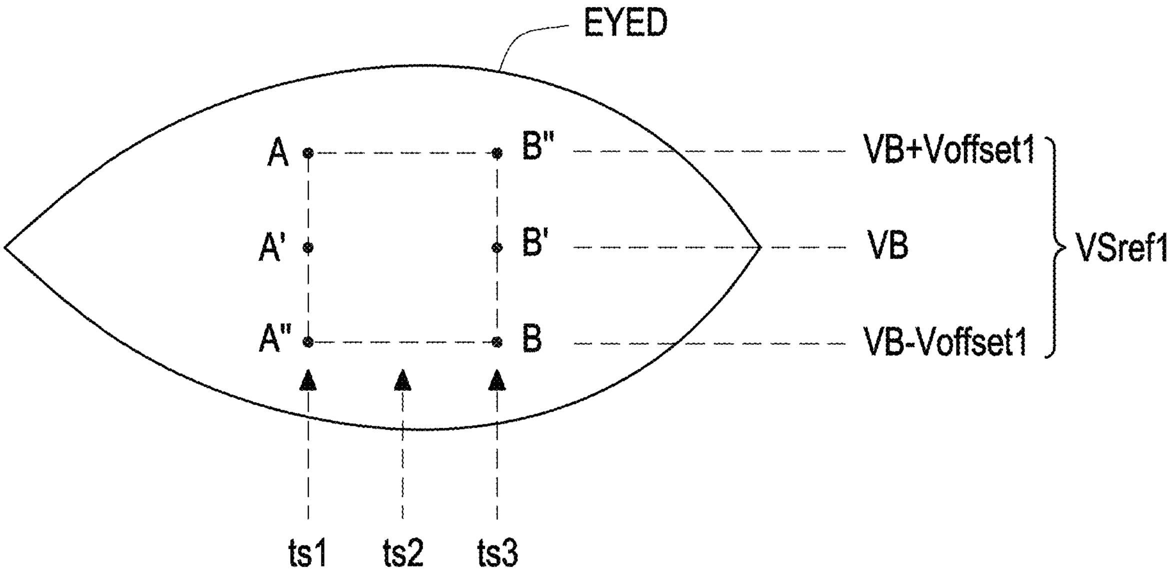
FIG. 2 shows a schematic diagram of monitoring an eye diagram of an input signal of a signal monitoring device of the disclosure.

Referring to FIG. 1 and FIG. 2 together below, FIG. 2 shows a schematic diagram of monitoring an eye diagram of an input signal of a signal monitoring device of the disclosure. In FIG. 2, sampling of an eye diagram EYED of the command/address signal DCA by the sampler 131 of the signal monitoring device 100 is taken as an example. The sampler 131 may sample at time points ts1, ts2, and ts3 respectively according to the clock signals CK1_*t*, CK_t, and CK2_*t*. The time point ts2 is the same as a sampling time point of the sampler 121, while the time point ts1 may be earlier than the time point ts2, and the time point ts3 may be later than the time point ts2.

It is worth mentioning that the sampler 131 is provided with a first sampling reference voltage VSref1. A value of the first sampling reference voltage VSref1 may be adjusted by setting a first offset voltage Voffset1 to obtain sampling points corresponding to different voltage values. For example, at the time points ts1 and ts3, the first sampling reference voltage VSref1 may be equal to the reference voltage VB, the reference voltage VB plus the first offset voltage Voffset1, and the reference voltage VB minus the first offset voltage Voffset1, respectively.

As shown in FIG. 2, by adjusting the first sampling reference voltage VSref1, and selecting different clock signals CK1_*t*, CK_t, and CK2_*t* to sample at different time points ts1 to ts3, multiple sampling points A, A', and A" corresponding to the time point ts1 and multiple sampling points B, B', and B" corresponding to the time point ts3 may be obtained. The first sampling reference voltage VSref1 corresponding to the sampling points A and B" is equal to the reference voltage VB plus the first offset voltage Voffset1. The first sampling reference voltage VSref1 corresponding to the sampling points A' and B' is equal to the reference voltage VB. The first sampling reference voltage VSref1 corresponding to the sampling points A" and B is equal to the reference voltage VB minus the first offset voltage Voffset1.

Similarly, the sampler 132 may sample the eye diagram EYED of the command/address signal DCA at three different time points respectively according to the clock signals CK1_*c*, CK_c, and CK2_*c* to obtain the sampling points. The sampler 132 may be provided with a second sampling reference voltage VSref2. A value of the second sampling reference voltage VSref2 may be adjusted by setting a second offset voltage Voffset2. For example, at each sampling time point, the second sampling reference voltage VSref2 may be equal to the reference voltage VB, the reference voltage VB plus the second offset voltage Voffset2, and the reference voltage VB minus the second offset voltage Voffset2, respectively. It should be noted that the second offset voltage Voffset2 may be different from the first offset voltage Voffset1, that is, the second sampling reference voltage VSref2 may be different from the first sampling reference voltage VSref1, so that the samplers 131 and 132 obtain more sampling points, helping to improve the accuracy of monitoring.

It is worth mentioning that the phases of the clock signals CK_t and CK_c complement each other in this embodiment. Therefore, the samplers 131 and 132 may not sample simultaneously, but may sample in sequence.

By comparing the first sampling signal DT_e generated by the sampler 121 with the third sampling signal MON1_*e* generated by the sampler 131, as well as comparing the second sampling signal DT_o generated by the sampler 122 with the fourth sampling signal MON1_*o* generated by the sampler 132, it may be known whether the eye diagram EYED of the command/address signal DCA has deteriorated. Furthermore, by adjusting the sampling time points of the samplers 131 and 132, and respectively comparing the first sampling signal DT_e with the third sampling signal MON1_*e*, and comparing the second sampling signal DT_o with the fourth sampling signal MON1_*o*, the change state of the eye diagram EYED of the command/address signal DCA may be further obtained.

Figure 3:
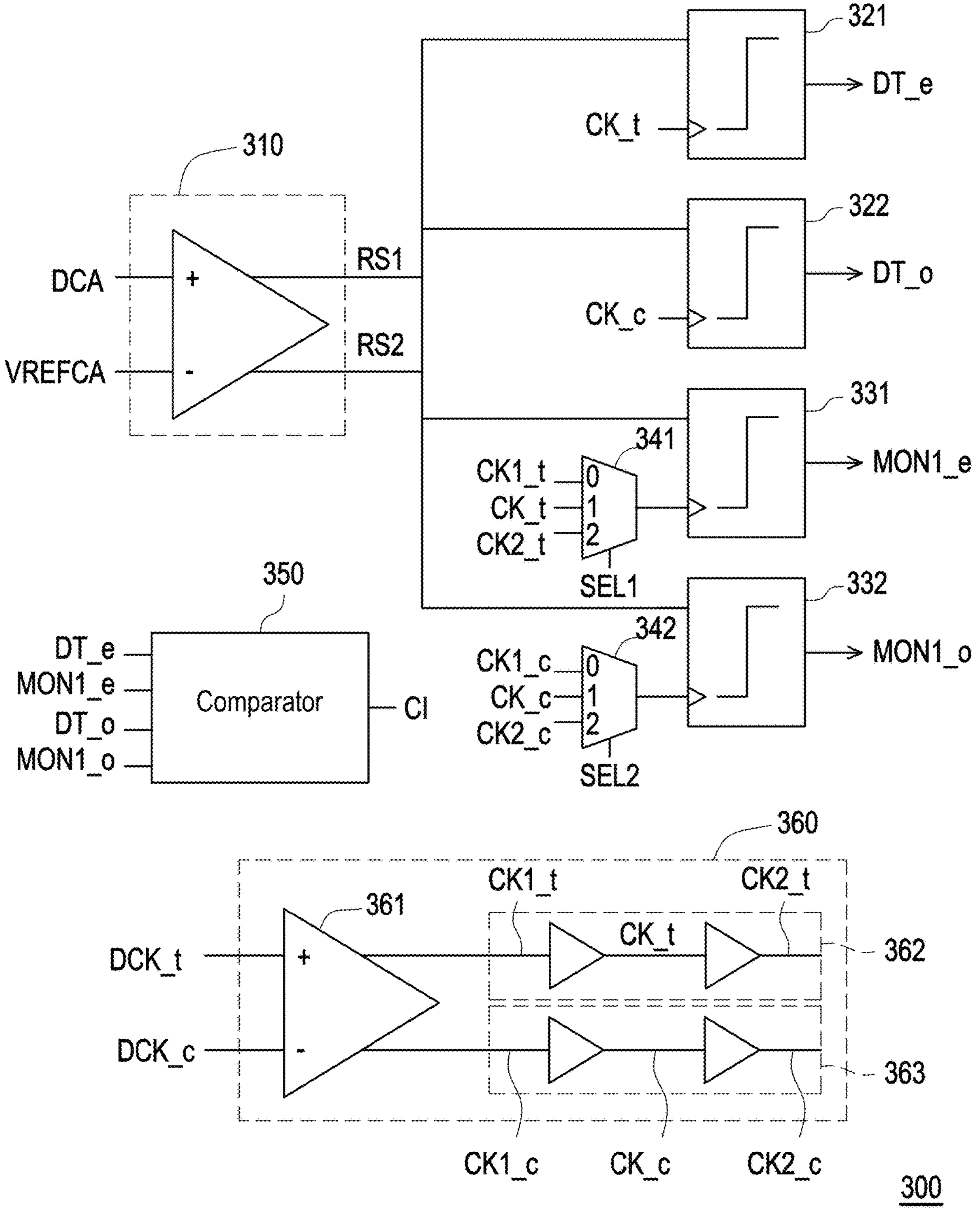
FIG. 3 shows a schematic diagram of a signal monitoring device according to another embodiment of the disclosure.

Referring to FIG. 3, FIG. 3 shows a schematic diagram of a signal monitoring device according to another embodiment of the disclosure. A signal monitoring device 300 includes a signal receiver 310, samplers 321, 322, 331, and 332, selectors 341 and 342, a comparator 350, and a clock signal generator 360. In this embodiment, the signal receiver 310, the samplers 321, 322, 331, and 332, and the selectors 341 and 342 are similar to those in the embodiment of FIG. 1, and therefore are not repeated here.

In this embodiment, the comparator 350 is coupled to output terminals of the samplers 321, 322, 331, and 332, and is configured to receive the first sampling signal DT_e, the second sampling signal DT_o, the third sampling signal MON1_*e*, and the fourth sampling signal MON1_*o*. The comparator 350 is configured to compare the first sampling signal DT_e with the third sampling signal MON1_*e*, and compare the second sampling signal DT_o with the fourth sampling signal MON1_*o*, to generate comparison result information CI.

In this embodiment, the clock signal generator 360 includes a differential amplifier 361 and delay units 362 and 363. Positive and negative input terminals of the differential amplifier 361 receive phase-complementary clock signals DCK_t and DCK_c, respectively. The two output terminals of the differential amplifier 361 output the clock signals CK1_*t* and CK1_*c*, respectively, and are coupled to the delay units 362 and 363, respectively. The delay unit 362 has multiple serially connected buffers, and outputs the clock signals CK_t and CK2_*t* in sequence by delaying the clock signal CK1_*t*. The clock signals CK1_*t*, CK_t, and CK2_*t* differ in sequence by a first time delay in timing. The delay unit 363 similarly has multiple serially connected buffers, and outputs the clock signals CK_c and CK2_*c* in sequence by delaying the clock signal CK1_*c*. The clock signals CK1_*c*, CK_c, and CK2_*c* differ in sequence by a second time delay in timing.

In this embodiment, each buffer in the delay units 361 and 362 may have the same transmission delay, that is, the first time delay is the same as and the second time delay. In other words, a phase difference between the clock signal CK1_*t* and the clock signal CK_t, a phase difference between the clock signal CK_t and the clock signal CK2_*t*, a phase difference between the clock signal CK1_*c* and the clock signal CK_c, and a phase difference between the clock signal CK_c and the clock signal CK2_*c* may be the same.

Incidentally, in this embodiment, the sampler 331 may sample the eye diagram of the signal according to three clock signals (CK1_*t*, CK_t, CK2_*t*) respectively, and the sampler 332 may also sample the eye diagram of the signal according to three clock signals (CK1_*c*, CK_c, CK2_*c*) respectively. In other embodiments of the disclosure, the samplers 331 and 332 may also execute sampling operation by selecting more than three clock signals to enhance the accuracy of the eye diagram sampling operation along a time axis. Similarly, in this embodiment, the sampler 331 may select three voltage values (the reference voltage VB, the reference voltage VB plus the first offset voltage Voffset1, and the reference voltage VB minus the first offset voltage Voffset1) as the first sampling reference voltage for sampling, and the sampler 332 may also select three voltage values (the reference voltage VB, the reference voltage VB plus the second offset voltage Voffset2, and the reference voltage VB minus the second offset voltage Voffset2) as the second sampling reference voltage for sampling. In other embodiments of the disclosure, the samplers 331 and 332 may also select more than three voltage values as corresponding sampling reference voltages to enhance the accuracy of the eye diagram sampling operation in terms of voltage values.

Figure 4:
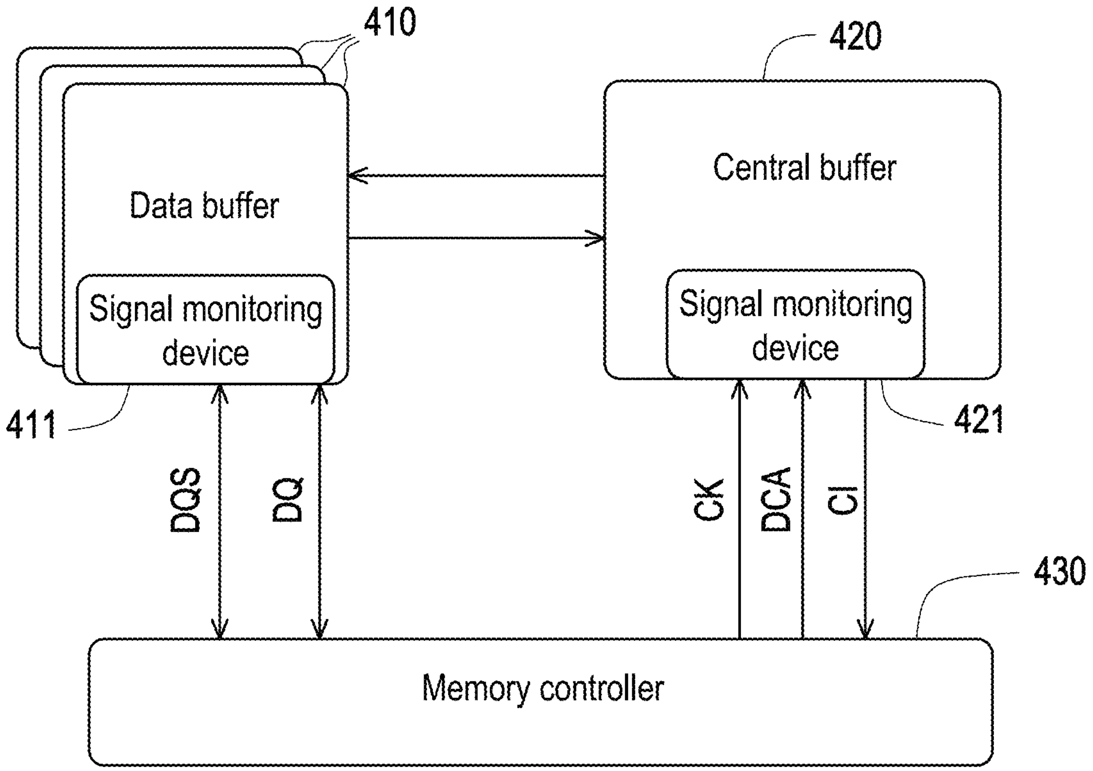
FIG. 4 shows a schematic diagram of a memory system according to an embodiment of the disclosure.

Referring to FIG. 4, FIG. 4 shows a schematic diagram of a memory system according to an embodiment of the disclosure. A memory system 400 may be a memory system compliant with standards of JEDEC double data rate synchronous dynamic random access memory (SDRAM). The standards of the memory system are, for example, JEDEC DDR, DDR2, DDR3, DDR4, DDR5, and standards of other double data rate memories. In addition, the memory system 400 may also be an internal memory compliant with other standards or protocols, such as RAMBUS internal memory, or may be a memory compliant with future memory standards or protocols.

The memory system 400 includes multiple data buffers 410, a central buffer 420, and a memory controller 430. The data buffers 410 are configured to store multiple data and be coupled to the memory controller 430 and the central buffer 420. The memory controller 430 conducts read or write operations of a data signal DQ with the data buffers 410 through a data strobe signal DQS. The central buffer 420 is coupled to the memory controller 430 to receive a command/address signal DCA from the memory controller 430, and sends a generated data access command to the data buffers 410 according to the command/address signals DCA. In some embodiments, the central buffer 420 may be a register clock driver (RCD). The memory controller 430 may be a main controller, such as a central processing unit (CPU).

The central buffer 420 has a signal monitoring device 421. The signal monitoring device 421 is coupled to the memory controller 430, and receives the clock signal CK and the command/address signal DCA sent by the memory controller 430. The signal monitoring device 421 may be implemented by the aforementioned signal monitoring device 100 or 300. Taking the signal monitoring device 300 as an example, the signal monitoring device 421 may generate the clock signals DCK_t and DCK_c in the signal monitoring device 300 according to the clock signal CK, and monitor the eye diagram of the command/address signal DCA according to the clock signals DCK_t and DCK_c.

The signal monitoring device 421 may generate comparison result information CI by comparing the sampling signals generated by the sampler thereof. The signal monitoring device 421 may transmit the comparison result information CI to the memory controller 430. The memory controller 430 may determine whether to conduct re-training according to the comparison result information CI. When the comparison result information CI indicates that the eye diagram of the command/address signal DCA has deteriorated, the memory controller 430 determines to conduct re-training.

The data buffer 410 also has a signal monitoring device 411. The signal monitoring device 411 may also be implemented by the aforementioned signal monitoring device 100 or 300. The signal monitoring device 411 is coupled between the memory controller 430 and the central buffer 420, and receives the data signal DQ and the data strobe signal DQS sent by the memory controller 430. The signal monitoring device 411 may generate phase-complementary clock signals DQS_t and DQS_c to monitor the eye diagram of the data signal DQ according to the data strobe signal DQS. The clock signals DQS_t and DQS_c are similar to the clock signals DCK_t and DCK_c in the embodiment of FIG. 3, and are not repeated here. The signal monitoring device 411 generates comparison result information CI by comparing the sampling signals of the sampler thereof. The comparison result information CI may be fed back to the memory controller 430 by the central buffer 420.

In this embodiment, for example, when the operating environment or operating voltage of the memory system 400 changes, the eye diagrams of the data signal DQ and the command/address signal DCA may deteriorate. Correspondingly, the comparison result information CI generated by the signal monitoring devices 411 and 421 may reflect the deterioration, thereby prompting the memory controller 430 to execute re-training.

Please refer to FIG. 3 and FIG. 4 together. During re-training, the signal monitoring device in this embodiment may also be configured to monitor the quality of the signal eye diagram. Taking the signal monitoring device 421 as an example, during re-training, the memory controller 430 may first adjust the phases of the clock signals selected by the samplers 331 and 332 in the signal monitoring device 421. For example, before re-training, the samplers 331 and 332 sample according to the clock signals CK_t and CK_c respectively. During re-training, the sampling clock signals of the samplers 331 and 332 may be adjusted. For instance, the samplers 331 and 332 may first sample according to the clock signals CK1_*t* and CK1_*c* respectively, then compare the first sampling signal DT_e with the third sampling signal MON1_*e*, and compare the second sampling signal DT_o with the fourth sampling signal MON1_*o*, to generate first comparison result information CI. Furthermore, the samplers 331 and 332 may sample according to the clock signals CK2_*t* and CK2_*c* respectively, continue to compare the first sampling signal DT_e with the third sampling signal MON1_*e*, and compare the second sampling signal DT_o with the fourth sampling signal MON1_*o*, to generate second comparison result information CI. When the first comparison result information CI indicates that the first sampling signal DT_e is the same as the third sampling signal MON1_*e*, and the second sampling signal DT_o is the same as the fourth sampling signal MON1_*o*, while the second comparison result information CI indicates that the first sampling signal DT_e is different from the third sampling signal MON1_*e*, and/or the second sampling signal DT_o is different from the fourth sampling signal MON1_*o*, the memory controller 430 may adjust the clock signals CK_t and CK_c by advancing the phases of the clock signals CK_t and CK_c. In another aspect, when the first comparison result information CI indicates that the first sampling signal DT_e is different from the third sampling signal MON1_*e*, and/or the second sampling signal DT_o is different from the fourth sampling signal MON1_*o*, while the second comparison result information CI indicates that the first sampling signal DT_e is the same as the third sampling signal MON1_*e*, and the second sampling signal DT_o is the same as the fourth sampling signal MON1_*o*, the memory controller 430 may adjust the clock signals CK_t and CK_c by delaying the phases of the clock signals CK_t and CK_c.

Further, during re-training, the memory controller 430 may also monitor the quality of the signal eye diagram by adjusting the voltage value of the sampling reference voltage of the samplers 331 and 332. Similarly, the memory controller 430 may conduct corresponding adjustments to the reference voltage VREFCA received by the signal receiver 310 according to the comparison result information CI.

Based on the above, in the embodiments of the disclosure, the signal monitoring device monitors the eye diagram of the signal (such as the command/address signal or the data signal) in real-time to detect deterioration due to changes in environment or voltage conditions. The re-training mechanism is triggered only when the deterioration of the eye diagram of the signal is detected, reducing the time cost associated with periodic re-training in existing technology and avoiding bandwidth reduction caused by frequent re-training. Additionally, the signal monitoring device of the disclosure sample by setting the clock signals and sampling reference voltages to identify specific areas of deterioration in the eye diagram of the signal when the deterioration occurs, which enables more targeted re-training and helps to improve the efficiency of the re-training process.

Finally, it should be noted that the aforementioned embodiments are only used to illustrate the technical solution of the disclosure, and are not limited thereto. Although the disclosure has been described in detail with reference to the foregoing embodiments, those skilled in the art should understand that the technical solutions recorded in the foregoing embodiments may still be modified, or equivalent substitutions for part or all of the technical features may be made. These modifications or substitutions do not make the corresponding technical solutions deviate from the scope of the technical solutions of the embodiments of the disclosure.

What is claimed is:

1. A signal monitoring device, comprising:

a signal receiver, receiving an input signal and a reference voltage, and generating a first receiving signal and a second receiving signal, wherein the first receiving signal and the second receiving signal are differential signals;

a first sampler, sampling the first receiving signal and the second receiving signal to generate a first sampling signal according to a first clock signal;

a second sampler, sampling the first receiving signal and the second receiving signal to generate a second sampling signal according to a second clock signal;

a third sampler, based on a first sampling reference voltage, sampling the first receiving signal and the second receiving signal to generate a third sampling signal according to one of a plurality of third clock signals; and a fourth sampler, based on a second sampling reference voltage, sampling the first receiving signal and the second receiving signal to generate a fourth sampling signal according to one of a plurality of fourth clock signals;

wherein the plurality of third clock signals differ in sequence by a first time delay in timing, the plurality of fourth clock signals differ in sequence by a second time delay in timing, and the first clock signal and the second clock signal complement each other in phase.

2. The signal monitoring device according to claim 1, further comprising:

a comparator, comparing the first sampling signal with the third sampling signal, and comparing the second sampling signal with the fourth sampling signal, to generate comparison result information, wherein the comparison result information is configured to indicate whether an eye diagram of the input signal has deteriorated.

3. The signal monitoring device according to claim 1, wherein a value of the first sampling reference voltage is adjusted according to a first offset voltage, and a value of the second sampling reference voltage is adjusted according to a second offset voltage.

4. The signal monitoring device according to claim 1, further comprising a first selector and a second selector, wherein the first selector selects one of the plurality of third clock signals according to a first selecting signal and transmits the third clock signal to the third sampler, and the second selector selects one of the plurality of fourth clock signals according to a second selecting signal and transmits the fourth clock signal to the fourth sampler.

5. The signal monitoring device according to claim 1, wherein the input signal is a command/address signal or a data signal from the memory controller.

6. The signal monitoring device according to claim 1, further comprising:

a clock signal generator, comprising:

a differential amplifier, receiving a first external clock signal and a second external clock signal corresponding to the input signal, and generating a first output signal and a second output signal;

a first delay unit, coupled to a first output terminal of the differential amplifier to receive the first output signal, and respectively obtaining the plurality of third clock signals by sequentially delaying the first output signal; and a second delay unit, coupled to the second output terminal of the differential amplifier to receive the second output signal, and respectively obtaining the plurality of fourth clock signals by sequentially delaying the second output signal.

7. The signal monitoring device according to claim 1, wherein the signal receiver is a differential amplifier, a first input terminal of the differential amplifier receives the input signal, a second input terminal of the differential amplifier receives the reference voltage, a first output terminal of the differential amplifier outputs the first receiving signal, and a second output terminal of the differential amplifier outputs the second receiving signal.

8. The signal monitoring device according to claim 1, wherein the reference voltage is between a maximum voltage and a minimum voltage of the input signal.

9. A memory system, comprising:

a memory controller;

a central buffer, coupled to the memory controller;

the central buffer comprising a first signal monitoring device, and the first signal monitoring device comprising:

a first signal receiver, receiving a first input signal and a first reference voltage, and generating a first receiving signal and a second receiving signal, wherein the first receiving signal and the second receiving signal are differential signals;

a first sampler, sampling the first receiving signal and the second receiving signal to generate a first sampling signal according to a first clock signal;

a second sampler, sampling the first receiving signal and the second receiving signal to generate a second sampling signal according to a second clock signal;

a third sampler, based on a first sampling reference voltage, sampling the first receiving signal and the second receiving signal to generate a third sampling signal according to one of a plurality of third clock signals; and a fourth sampler, based on a second sampling reference voltage, sampling the first receiving signal and the second receiving signal to generate a fourth sampling signal according to one of a plurality of fourth clock signals;

wherein the plurality of third clock signals differ in sequence by a first time delay in timing, the plurality of fourth clock signals differ in sequence by a second time delay in timing, and the first clock signal and the second clock signal complement each other in phase.

10. The memory system according to claim 9, further comprising:

a plurality of data buffers, coupled between the central buffer and the memory controller; each of the plurality of data buffers comprising a second signal monitoring device, and the second signal monitoring device comprising:

a second signal receiver, receiving a second input signal and a second reference voltage, and generating a third receiving signal and a fourth receiving signal, wherein the third receiving signal and the fourth receiving signal are differential signals;

a fifth sampler, sampling the third receiving signal and the fourth receiving signal to generate a fifth sampling signal according to a fifth clock signal;

a sixth sampler, sampling the third receiving signal and the fourth receiving signal to generate a sixth sampling signal according to a sixth clock signal;

a seventh sampler, sampling the third receiving signal and the fourth receiving signal to generate a seventh sampling signal according to one of a plurality of seventh clock signals, and based on a third sampling reference voltage; and an eighth sampler, sampling the third receiving signal and the fourth receiving signal to generate an eighth sampling signal according to one of a plurality of eighth clock signals, and based on the fourth sampling reference voltage;

wherein, the plurality of seventh clock signals differ in sequence by a third time delay in timing, the plurality of eighth clock signals differ in sequence by a fourth time delay in timing, and the fifth clock signal and the sixth clock signal complement each other in phase.

11. The memory system according to claim 9, wherein the first signal monitoring device further comprises:

a first comparator, comparing the first sampling signal with the third sampling signal, and comparing the second sampling signal with the fourth sampling signal, to generate first comparison result information, wherein the first comparison result information is configured to indicate whether the eye diagram of the first input signal has deteriorated.

12. The memory system according to claim 10, wherein the second signal monitoring device further comprises:

a second comparator, comparing the fifth sampling signal with the seventh sampling signal, and comparing the sixth sampling signal with the eighth sampling signal, to generate second comparison result information, wherein the second comparison result information is configured to indicate whether the eye diagram of the second input signal has deteriorated.

13. The memory system according to claim 11, wherein the memory controller receives the first comparison result information, and determines whether to re-train an interface corresponding to the first input signal according to the first comparison result information.

14. The memory system according to claim 12, wherein the memory controller receives the second comparison result information, and determines whether to re-train an interface corresponding to the second input signal according to the second comparison result information.

15. The memory system according to claim 9, wherein a value of the first sampling reference voltage is adjusted according to a first offset voltage, and a value of the second sampling reference voltage is adjusted according to a second offset voltage.

16. The memory system according to claim 10, wherein a value of the third sampling reference voltage is adjusted according to a third offset voltage, and a value of the fourth sampling reference voltage is adjusted according to a fourth offset voltage.

17. The memory system according to claim 9, wherein the first signal monitoring device further comprises:

a first clock signal generator, comprising:

a first differential amplifier, receiving a first external clock signal and a second external clock signal corresponding to the first input signal, and generating a first output signal and a second output signal;

a first delay unit, coupled to the first output of the first differential amplifier to receive the first output signal, and obtaining the plurality of third clock signals by sequentially delaying the first output signal; and a second delay unit, coupled to the second output of the first differential amplifier to receive the second output signal, and obtaining the plurality of fourth clock signals by sequentially delaying the second output signal.

18. The memory system according to claim 10, wherein the second signal monitoring device further comprises:

a second clock signal generator, comprising:

a second differential amplifier, receiving a third external clock signal and a fourth external clock signal corresponding to the second input signal, and generating a third output signal and a fourth output signal;

a third delay unit, coupled to the first output of the second differential amplifier to receive the third output signal, and obtaining the plurality of seventh clock signals by sequentially delaying the third output signal; and a fourth delay unit, coupled to the second output of the second differential amplifier to receive the fourth output signal, and obtaining the plurality of eighth clock signals by sequentially delaying the fourth output signal.

19. The memory system according to claim 9, wherein the first input signal is a command/address signal from the memory controller.

20. The memory system according to claim 10, wherein the second input signal is a data signal from the memory controller.

* * * * *